(12) United States Patent
Morimoto et al.

(10) Patent No.: US 6,201,445 B1
(45) Date of Patent: Mar. 13, 2001

(54) HIGH FREQUENCY POWER AMPLIFIER

(75) Inventors: Shigeru Morimoto, Moriguchi; Masahiro Maeda, Osaka, both of (JP)

(73) Assignee: Matsushita Electric Industrial Co., Ltd., Kadoma (JP)

( * ) Notice: Subject to any disclaimer, the term of this patent is extended or adjusted under 35 U.S.C. 154(b) by 0 days.

(21) Appl. No.: 09/260,879

(22) Filed: Mar. 2, 1999

(30) Foreign Application Priority Data

Mar. 4, 1998 (JP) .................................................. 10-051705

(51) Int. Cl.⁷ ......................................................... H03F 3/68
(52) U.S. Cl. ............................................. 330/295; 330/286
(58) Field of Search ................................. 330/295, 124 R, 330/302, 286

(56) References Cited

U.S. PATENT DOCUMENTS

| | | | |
|---|---|---|---|
| 5,111,157 | * | 5/1992 | Komiak ................................. 330/295 |
| 5,274,341 | * | 12/1993 | Sekine et al. ........................ 330/295 |
| 5,999,058 | * | 12/1999 | Saitou et al. ......................... 330/286 |

OTHER PUBLICATIONS

Ono F et al: "A 50W Low Distortion Gaas Mesfet For Digital Cellular Base Stations" Gaas Ic Symposium: IEEE Gallium Arsenide Integrated Circuit Symposium Technical Digest 1996, Orlando, FL, Nov. 3–6, 1996, No. Symp. 18,Nov. 3, 1996, pp. 103–106, XP000659840.

Institute of Electrical And Electronics Engineers.

* cited by examiner

*Primary Examiner*—Robert Pascal
*Assistant Examiner*—Khanh Van Nguyen
(74) *Attorney, Agent, or Firm*—Renner, Otto, Boisselle & Sklar LLP

(57) ABSTRACT

A high frequency power amplifier includes: a pair of power amplifying elements; a power divider, provided in the vicinity of an input terminal of the high frequency power amplifier, for supplying the pair of power amplifying elements with signals, respectively, the signals having an identical amplitude with each other and having reverse phases from each other; and a power synthesizer, provided in the vicinity of an output terminal of the high frequency power amplifier, for synthesizing signals output from the pair of power amplifying elements, the signals having an identical amplitude with each other and having reverse phases from each other. Output terminals of the power amplifying elements are connected to each other through a third-order harmonic component controlling circuit, and the third-order harmonic component controlling circuit includes a series connection of a transmission line having a length of $\frac{1}{12}$ of a fundamental wavelength, a capacitor, and another transmission line having a length of $\frac{1}{12}$ of the fundamental wavelength.

3 Claims, 4 Drawing Sheets

HIGH FREQUENCY POWER AMPLIFIER

BACKGROUND OF THE INVENTION

1. Field of the Invention

The present invention relates to a power amplifier, specifically to a push-pull high output, high frequency power amplifier operating at a high efficiency in a microwave band.

2. Description of the Related Art

A conventional high frequency power amplifier will be described.

Conventionally, a push-pull power amplifier circuit for operating two power amplifying elements (for example, FETs) in reverse phases from each other and synthesizing output signals from the power amplifying elements to provide an output signal is known.

FIG. 4 is a block diagram of a conventional high frequency power amplifier 400 disclosed in Japanese Laid-Open Publication No. 5-29851.

In FIG. 4, a signal input from an input terminal 401 is divided into two signals by a power divider 402. The two signals have reverse phases from each other and have the same amplitude as each other. The two signals are input to a pair of FETs 405 through input-side matching circuits 403, respectively. The pair of FETs 405 are connected in parallel. A gate of each FET 405 is biased through a resistor 404, and a drain of each FET 405 is biased through a coil 409. A distributed constant line 406, provided in connection with an output of each FET 405, is connected to a power synthesizer 411 through a capacitor 410. The distributed constant lines 406 are connected to each other, through a capacitor 407 for controlling third-order harmonic components, at a point of each distributed constant line 406 which is a distance away from the output of the corresponding FET 405, the distance being $1/12$ of the fundamental wavelength to be amplified. The distributed constant lines 406 are also connected to each other, through a capacitor 408 for controlling fundamental wave components, between the connection points of the distributed constant lines 406 and the capacitor 407, and the power synthesizer 411.

The two signals having the reverse phases and the same amplitude and amplified by the pair of FETs 405 are input to the power synthesizer 411 through an output-side matching circuit 420. The matching circuit 420 includes the distributed constant lines 406, the capacitor 407, the capacitor 408, and capacitors 410. Then, the signals are synthesized and output to an output terminal 412.

In such a conventional high frequency power amplifier 400, a load impedance with respect to the third-order harmonic components at the output of the FET 405 becomes as high as open, e.g., nearly 100 $\Omega$, due to the distributed constant lines 406 and the capacitor 407. Thus, the pair of FETs 405 operate at a high efficiency.

In this specification, the expression "as high as open" refers to "as high as, for example, nearly 100 $\Omega$".

A high frequency power amplifier for transmitting signals used in wireless communication devices such as, for example, cellular phones is generally demanded to have a high output and a high efficiency in operation. In order to make maximum use of the inherent characteristics of the power amplifying elements used in a high frequency power amplifier, the load impedance needs to have a value in a limited range at an input and an output of the power amplifying element. Accordingly, very fine adjustments are required to configure a matching circuit.

In the conventional high frequency power amplifier 400, the capacitor 408 for controlling the fundamental wave components and the capacitor 407 for controlling the third-order harmonic components are connected to the same distributed constant lines 406. In such a structure, control of the load impedance at the outputs of the power amplifying elements is complicated, thereby making it difficult to optimize the load impedances with respect to both the fundamental wave components and the third-order harmonic components.

SUMMARY OF THE INVENTION

A high frequency power amplifier according to the present invention includes: a pair of power amplifying elements; a power divider, provided in the vicinity of an input terminal of the high frequency power amplifier, for supplying the pair of power amplifying elements with signals, respectively, the signals having an identical amplitude with each other and having reverse phases from each other; and a power synthesizer, provided in the vicinity of an output terminal of the high frequency power amplifier, for synthesizing signals output from the pair of power amplifying elements, the signals having an identical amplitude with each other and having reverse phases from each other. Output terminals of the power amplifying elements are connected to each other through a third-order harmonic component controlling circuit, and the third-order harmonic component controlling circuit includes a series connection of a transmission line having a length of $1/12$ of a fundamental wavelength, a capacitor, and another transmission line having a length of $1/12$ of the fundamental wavelength.

In one embodiment of the invention, input terminals of the power amplifying elements are connected to each other through the third-order harmonic component controlling circuit.

In one embodiment of the invention, the third-order harmonic component controlling circuit is provided on a high dielectric constant substrate.

According to the present invention, optimum matching with respect to the fundamental wave components is easily realized while maintaining the load impedance with respect to the third-order harmonic components at the inputs and outputs of the power amplifying elements as high as open.

When the impedances at the inputs and outputs of the power amplifying elements are excessively low, an internal matching system can be adopted in order to facilitate impedance matching in such a manner that compact high dielectric constant substrates are provided in the vicinity of the inputs and outputs of the power amplifying elements and connected therewith by bonding wires, thereby raising the impedances at the inputs and outputs. In such a system, the third-order harmonic component controlling circuit is provided on the dielectric constant substrate for internal matching.

Thus, the invention described herein makes possible the advantages of providing a highly efficient and compact high frequency power amplifier for easily optimizing load impedances with respect to both the fundamental wave components and the third-order harmonic components.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of illustrative examples with reference to the accompanying drawings.

EXAMPLE 1

A high frequency power amplifier 100 in a first example of the present invention will be described.

Figure 1:
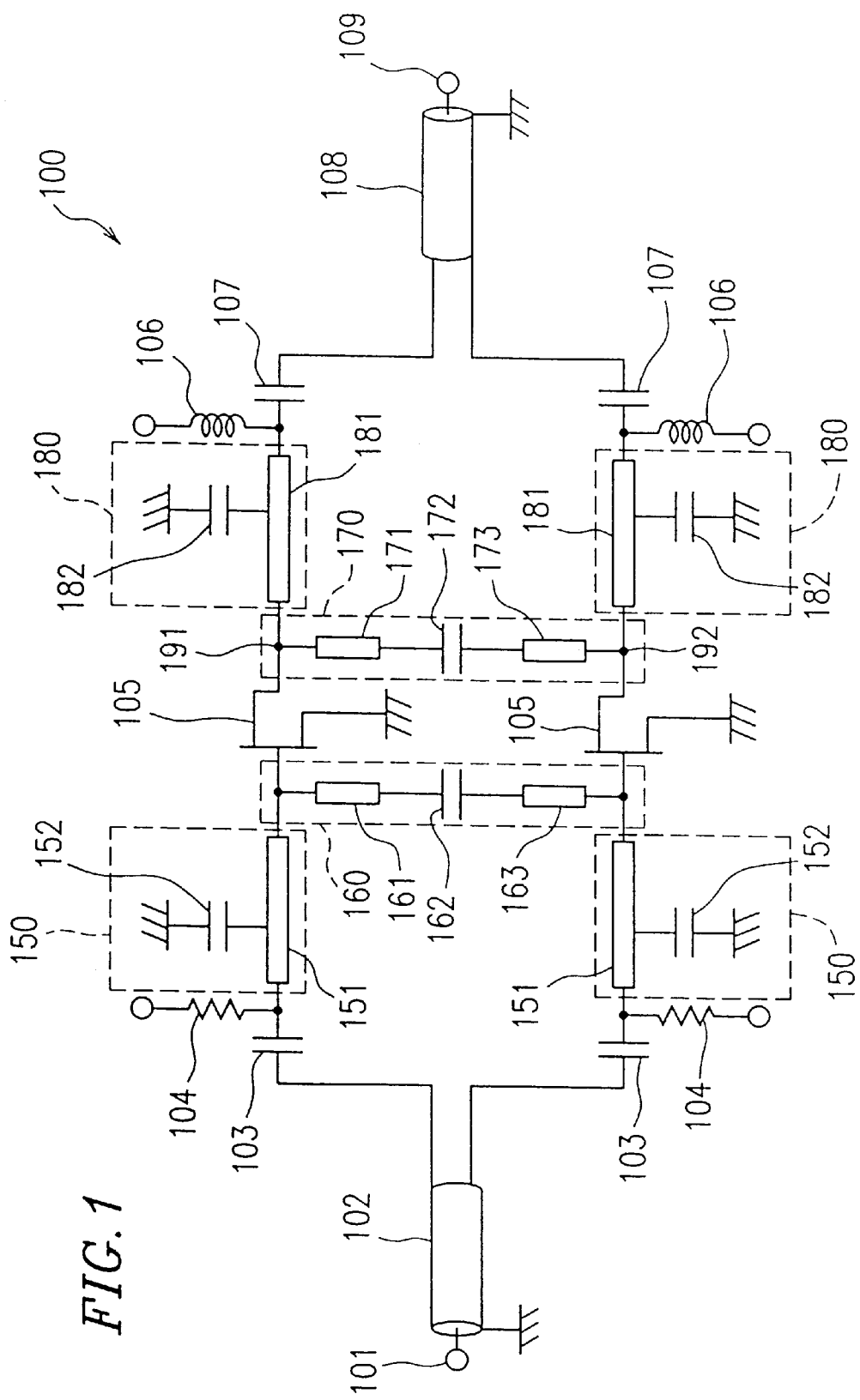
FIG. 1 is a diagram showing a high frequency power amplifier in a first example according to the present invention.

FIG. 1 is a diagram showing a high frequency power amplifier 100.

A signal input from an input terminal 101 is divided into two signals by a power divider 102. The two signals have the same amplitude as each other and have a phase difference of 180 degrees. The two signals each pass through an input-side matching circuit 150 for obtaining impedance matching with respect to fundamental wave components through a DC cut capacitor 103, and are input to a power amplifying element (hereinafter, referred to as an "FET") 105. The matching circuit 150 includes a microstrip line (transmission line) 151 and a capacitor 152. A gate of each FET 105 is biased through a resistor 104 for supplying a gate bias, and a drain of each FET 105 is biased through a coil 106 for supplying a drain bias. The signal input to the FET 105 is amplified and output. When the amplitude of the signal input to the FET 105 is excessively large, the FET 105 outputs harmonic components as well as a fundamental wave component. The signals which are input to the respective FETs 105 have a phase difference of 180 degrees. Accordingly, the fundamental wave components and odd-numbered-order harmonic components have a phase difference of 180 degrees between the inputs of the FETs 105 and between the outputs of the FETs 105, and the even-numbered-order harmonic components have a phase difference of 0 degrees between the inputs and between the outputs of the FETs 105.

Outputs 191 and 192 of the FETs 105 are connected to each other by a third-order harmonic component controlling circuit 170. The third-order harmonic component controlling circuit 170 has a symmetrical structure; i.e., has $\lambda/12$-long microstrip lines 171 and 173 and a capacitor 172 interposed therebetween. Herein, the symbol "$\lambda$" indicates a wavelength of a fundamental wave component (i.e., the fundamental wavelength).

Figure 2:
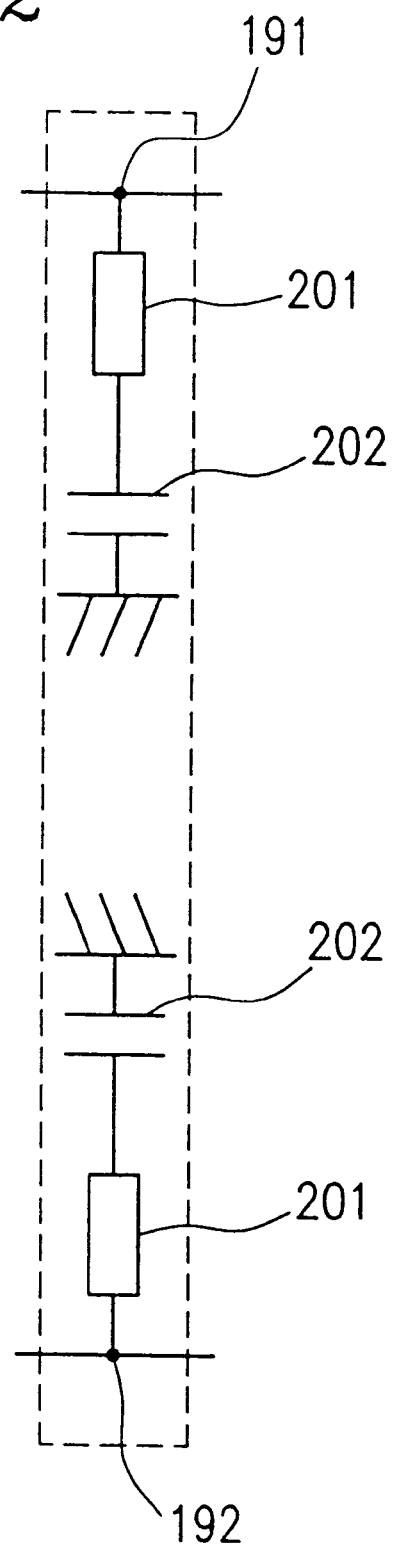
FIG. 2 is an equivalent circuit diagram of a third-order harmonic component controlling circuit in the first example and a second example according to the present invention.

FIG. 2 is an equivalent circuit diagram of the third-order harmonic component controlling circuit 170 with respect to the odd-numbered-order harmonic components. The third-order harmonic component controlling circuit 170 in FIG. 1 is equivalent to $\lambda/12$-long microstrip lines 201 and capacitors 202 connected in series with the outputs 191 and 192, respectively, and grounded as shown in FIG. 2.

The load impedance with respect to the third-order harmonic components at each of the outputs 191 and 192 of the FETs 105 is maintained as high as open by adjusting the capacitance of the capacitor 172.

Inputs of the FETs 105 are connected to each other through a third-order harmonic component controlling circuit 160. The third-order harmonic component controlling circuit 160 includes $\lambda/12$-long microstrip lines 161 and 163 and a capacitor 162 interposed therebetween. The third-order harmonic component controlling circuit 160 is also represented by the equivalent circuit shown in FIG. 2 with respect to the odd-numbered-order harmonic components. The load impedance with respect to the third-order harmonic components at the input of each FET 105 is adjusted to be as high as open.

Even in the case where the length of each of the microstrip lines 171 and 173 is slightly different from $\lambda/12$, desirable characteristics can be obtained by fine-adjusting the capacitor 172. Similarly, even in the case where the length of each of the microstrip lines 161 and 163 is slightly different from $\lambda/12$, desirable characteristics can be obtained by fine-adjusting the capacitor 162.

The signals output from the FETs 105 each pass through a matching circuit 180 for realizing impedance matching with respect to fundamental wave components and are each input to a power synthesizer 108 through a DC cut capacitor 107. The fundamental wave component controlling circuit 180 includes a microstrip line 181 and a capacitor 182. Thus, the two signals input to the power synthesizer 108, the two signals having a phase difference of 180 degrees in terms of the fundamental wave components, are synthesized and output from an output terminal 109.

As described above, the third-order harmonic component controlling circuits 160 and 170 are both independent from the matching circuits 150 and 180 for the fundamental wave components and are connected in the vicinity close to the inputs and outputs of FETs 105. Accordingly, when the third-order harmonic component controlling circuit 170 is optimized, the load impedances at the inputs and outputs of the FETs 105 with respect to the third-order harmonic components are maintained as high as open even when the matching circuits 150 and 180 for fundamental wave components are fine-adjusted. Therefore, the high frequency power amplifier 100 in the first example easily optimizes the impedances with respect to both the fundamental wave components and the third-order harmonic components, and is highly efficient and compact.

EXAMPLE 2

A high frequency power amplifier 300 in a second example according to the present invention will be described.

Figure 3:
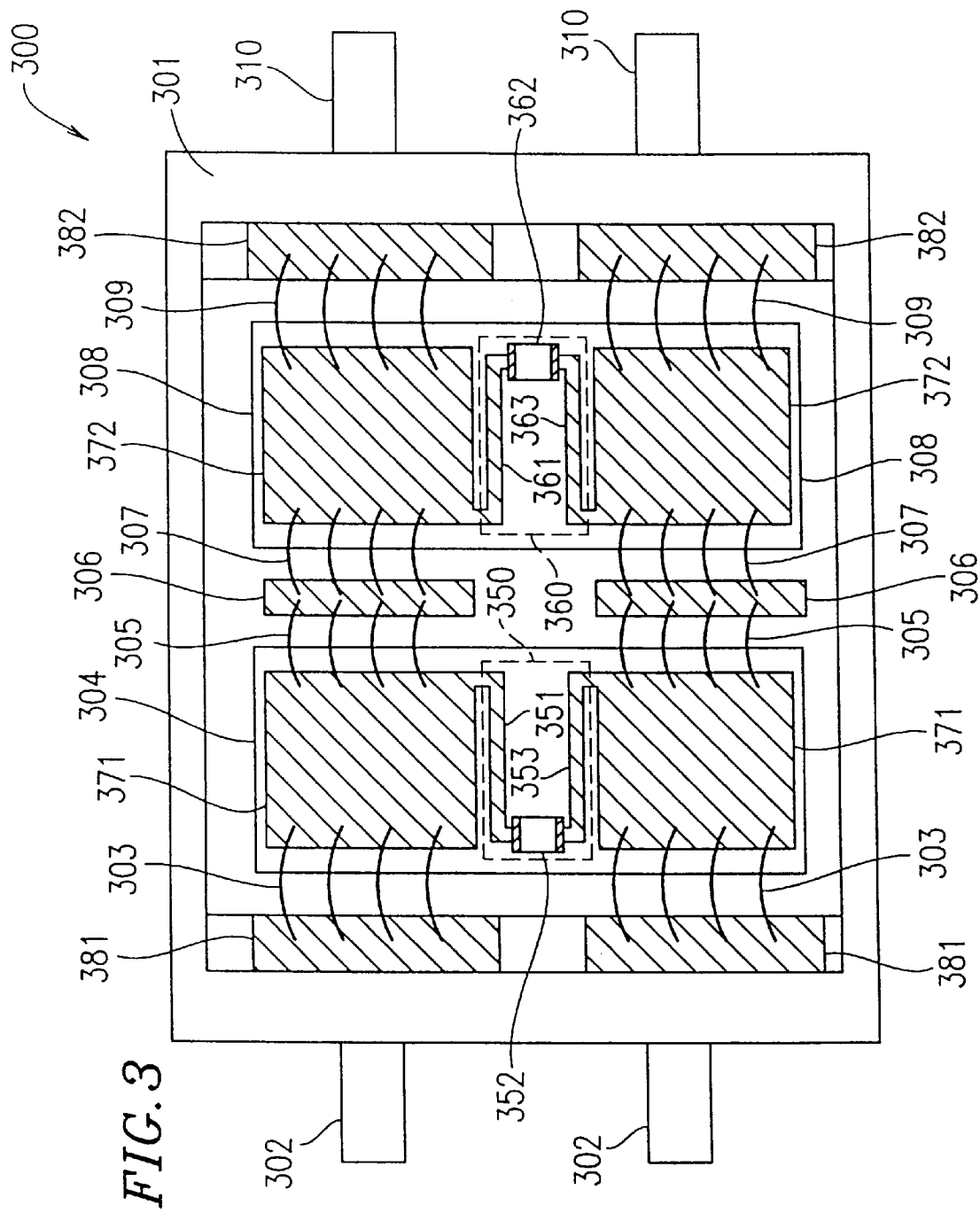
FIG. 3 is a plan view of a high frequency power amplifier in the second example according to the present invention.
Figure 4:
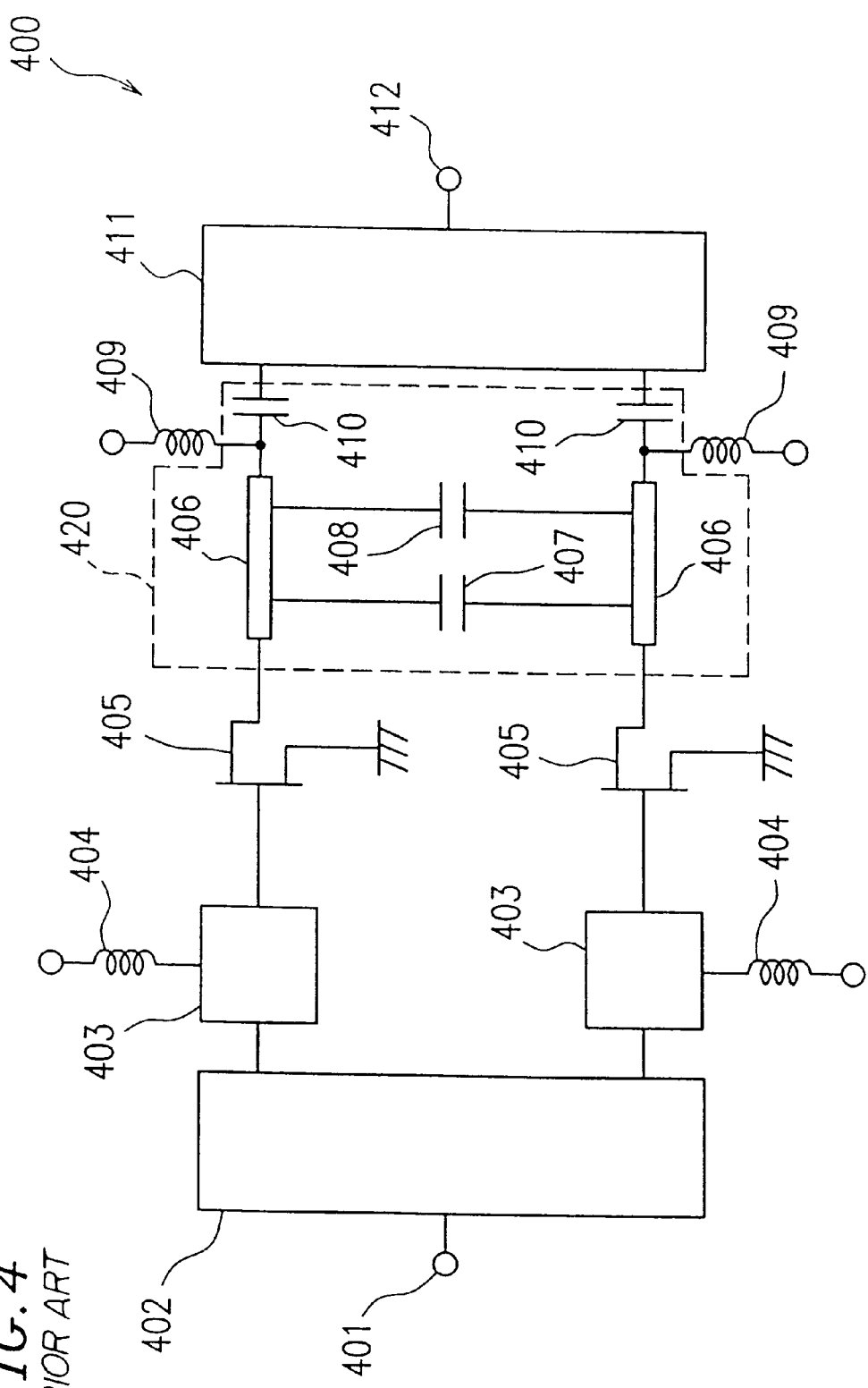
FIG. 4 is a block diagram of a conventional high frequency power amplifier.

FIG. 3 is a plan view of the high frequency power amplifier 300.

A plurality of FET chips 306, mounted on a package 301, are each connected to an electrode 371 by bonding wires 305. The electrodes 371 are provided on a high dielectric constant substrate 304 provided in the vicinity of input terminals 302 of the high frequency power amplifier 300. The high dielectric constant substrate 304 is rectangular and planar. Each of the FET chips 306 is also connected to an electrode 372 by bonding wires 307. The electrode 372 is provided on a high dielectric constant substrate 308 provided in the vicinity of output terminals 310 of the high frequency power amplifier 300. The high dielectric constant substrate 308 is rectangular and planar.

The electrodes 371, provided on the high dielectric constant substrate 304, are each connected to an input-side electrode 381 in the package 301 by bonding wires 303, and the electrodes 372, provided on the high dielectric constant substrate 308, are each connected to an output-side electrode 382 in the package 301 by bonding wires 309.

The high frequency power amplifier 300 in the second example operates in, for example, the following manner.

A signal input to each of the input terminals 302 in the package 301 is input to the corresponding FET chip 306 through the electrode 381, the bonding wires 303, the electrode 371, and the bonding wires 305.

In order to obtain a high output at the FET chip 306, the FET chip 306 needs to have a sufficiently large gate width. As the gate width of the FET chip 306 becomes larger, the impedances at the input and output of the FET chip 306 becomes lower. When the input impedance is reduced, the ratio of the impedance of an external matching circuit with respect to the impedance at the input is raised, which increases the impedance conversion loss of the matching circuit. In order to avoid such an inconvenience, the high dielectric constant substrate 304 is connected at a maximum proximity to the input of the FET chip 306 by the bonding wires 303 and 305, thereby converting the impedance at the input terminal 302 of the package 301 at a sufficiently high efficiency and thus restricting the impedance conversion loss of the external matching circuit. The same structure is also used regarding the output terminals 310 of the package 301. Such a circuit, which is mounted inside the package 301, is referred to as an "internal matching circuit".

As described above, a signal input to the FET chip 306 is amplified and output. When the amplitude of the signal is excessively large, the FET chip 306 outputs harmonic components as well as a fundamental wave component. Since the signals which are input to the respective FET chips 306 have a phase difference of 180 degrees, the fundamental wave components and odd-numbered-order harmonic components have a phase difference of 180 degrees between the inputs and between the outputs of the FET chips 306, and the even-numbered-order harmonic components have a phase difference of 0 degrees between the inputs and between the outputs of the FET chips 306.

The pair of electrodes 371, provided on the high dielectric constant substrate 304, are connected to each other by a third-order harmonic component controlling circuit 350. The third-order harmonic component controlling circuit 350 has a symmetrical structure; i.e., it has $\lambda/12$-long microstrip lines 351 and 353 and a chip capacitor 352 interposed therebetween. As described in the first example, the third-order harmonic component controlling circuit 350 is represented by an equivalent circuit shown in FIG. 2, and the load impedance with respect to the odd-numbered-harmonic components at the input of the FET chip 306 is maintained as high as open.

A signal output from each of the power amplifying element 306 is output from the corresponding output terminal 310 through the bonding wires 307, the electrode 372, bonding wires 309 and the electrode 382.

On the high dielectric constant substrate 308 on the output side, a third-order harmonic component controlling circuit 360 is provided. The third-order harmonic component controlling circuit 360 has a symmetric structure; i.e., it has $\lambda/12$-long microstrip lines 361 and 363 and a chip capacitor 362 interposed therebetween. The load impedance with respect to the odd-numbered-order harmonic components at the output of the FET chip 306 is adjusted to be as high as open.

Since the third-order harmonic component controlling circuits 350 and 360 are provided on the high dielectric constant substrates 304 and 308, respectively, as described above, the length of the $\lambda/12$-long microstrip lines 361 and 363 can be as short as possible. Accordingly, the high frequency power amplifier 300 can be made to be compact.

It should be noted that it is not necessary to strictly set the length of each of the transmission lines to be included in the third-order harmonic component controlling circuit at $\frac{1}{12}$ of the fundamental wavelength $\lambda$. Even when these transmission lines each have a length slightly different from $\lambda/12$ with respect to the fundamental wavelength $\lambda$, similar advantages as set forth in the present specification can be obtained. The skilled artisan would readily determine, based on the disclosure of the present application, an acceptable difference of the lengths of these transmission lines from $\lambda/12$ with respect to the fundamental wavelength $\lambda$.

As described above, according to a push-pull power amplifier in which a pair of power amplifying elements operate in the reverse phase to each other, optimum impedance matching with respect to the fundamental wave components is easily realized while maintaining the load impedance with respect to the third-order harmonic components as high as open without enlarging the amplifier.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A high frequency power amplifier, comprising:

a pair of power amplifying elements;

a power divider, provided in the vicinity of an input terminal of the high frequency power amplifier, for supplying the pair of power amplifying elements with signals, respectively, the signals having an identical amplitude with each other and having reverse phases from each other; and a power synthesizer, provided in the vicinity of an output terminal of the high frequency power amplifier, for synthesizing signals output from the pair of power amplifying elements, the signals having an identical amplitude with each other and having reverse phases from each other, wherein output terminals of the power amplifying elements are connected through respective matching circuits for a fundamental wavelength to the power synthesizer, and are connected to each other through a third-order harmonic component controlling circuit, the third-order harmonic component controlling circuit including a series of a transmission line having a length of $\frac{1}{12}$ of the fundamental wavelength, a capacitor, and another transmission line having a length of $\frac{1}{12}$ of the fundamental wavelength, the third-order harmonic controlling circuit being structurally independent of the respective matching circuits.

2. A high frequency power amplifier according to claim 1, wherein input terminals of the power amplifying elements are connected to each other through another third-order harmonic component controlling circuit.

3. A high frequency power amplifier according to claim 1, wherein the third-order harmonic component controlling circuit is provided on a high dielectric constant substrate.

* * * * *